United States Patent [19]

Reithel et al.

[11] Patent Number: 4,942,103

[45] Date of Patent: Jul. 17, 1990

[54] SOLID STATE COLOR IMAGING SENSOR HAVING A COLOR FILTER ARRAY

[75] Inventors: Raymond F. Reithel; Richard C. Sutton, both of Rochester, N.Y.

[73] Assignee: Eastman Kodak Company, Rochester, N.Y.

[21] Appl. No.: 212,381

[22] Filed: Jun. 24, 1988

[51] Int. Cl.$^5$ .......................... G03C 8/42; G03C 1/66
[52] U.S. Cl. ........................................ 430/7; 430/213; 430/238; 430/245; 430/320; 430/289; 430/371; 430/510; 430/511; 430/518; 430/941
[58] Field of Search ............... 430/245, 510, 511, 518, 430/371, 238, 289, 213, 941, 7, 320

[56] References Cited

U.S. PATENT DOCUMENTS

| | | | |
|---|---|---|---|
| 3,284,208 | 11/1966 | Land | 96/118 |
| 3,925,082 | 12/1975 | Fielding et al. | 96/76 |
| 4,124,386 | 11/1978 | Yoshida et al. | 96/29 |
| 4,204,866 | 5/1980 | Horak et al. | 430/306 |
| 4,220,700 | 9/1980 | McGuckin et al. | 430/143 |
| 4,220,705 | 9/1980 | Sugibuchi et al. | 430/294 |
| 4,273,853 | 6/1981 | Ponticello et al. | 430/213 |
| 4,315,978 | 2/1982 | Hartman | 430/4 |
| 4,388,387 | 6/1983 | Tsuboi | 430/7 |
| 4,450,224 | 5/1984 | Klein et al. | 430/213 |
| 4,533,621 | 8/1985 | Ikeuchi et al. | 430/213 |
| 4,580,159 | 4/1986 | Manabe | 358/44 |
| 4,647,519 | 3/1987 | Spiegel | 430/274 |
| 4,730,725 | 5/1988 | Idelson | 96/81 |

FOREIGN PATENT DOCUMENTS 0249991  3/1979  European Pat. Off.
2093041A  9/1984  United Kingdom.

OTHER PUBLICATIONS

Research Disclosure 17643, Dec. 1978, pp. 22–31.

*Primary Examiner*—Paul R. Michl
*Assistant Examiner*—Thoel Chea
*Attorney, Agent, or Firm*—William J. Davis

[57] ABSTRACT

A solid state color image sensing device comprising a semiconductive support having a surface comprising an array of light sensing pixels and superimposed thereon in microregistration a color filter array having at least three sets of dyed filter elements is characterized in that at least one set of the filter elements is formed from a negative-working dyeable photoresist composition comprising, in admixture, (a) a poly(vinyl alcohol) binder,
(b) a radiation-sensitive dichromate, and
(c) a polymeric mordant comprising recurring units derived from a quaternized N-vinylimidazole.

Color filter elements prepared from the dyeable photoresist composition have high resolution, excellent clarity and dye uptake, and low absorbance of blue light and thus are particularly useful in high quality high resolution solid state color imaging sensors having excellent thermal and light stability. A method of making the above-described device is disclosed.

4 Claims, No Drawings

SOLID STATE COLOR IMAGING SENSOR HAVING A COLOR FILTER ARRAY

CROSS REFERENCE TO RELATED APPLICATION

Reference is hereby made to commonly assigned copending U.S. Patent Application Ser. No. 211,810 entitled, NEGATIVE WORKING DYEABLE PHOTORESIST, filed in the names of R. F. Reithel and R. C. Sutton concurrently herewith.

FIELD OF THE INVENTION

This invention relates to solid state color image sensing devices having a color filter array and to methods for making them.

BACKGROUND OF THE INVENTION

In a useful method for the fabrication of color filter elements for solid state electronic color image sensing devices, for example, CCD, CID and MOS devices, dyed filter elements are formed by coating photopatternable layers, imagewise exposing, washing off unexposed layer portions, and then dyeing the remaining filter layer by dye imbibition.

In one approach, hydrophilic colloids, for example, gelatin, can be suspended in water along with a radiation responsive hardening (i.e., crosslinking) agent to Form the photopatternable composition. The hydrophilic colloid can be employed in combination with a dichromate salt employed as the radiation responsive hardening agent.

In another important approach, diazo resins are the photoresponsive polymers for forming the photopatternable composition. The diazo resin can be mixed with a mordant to produce a photopatternable composition employed to form the dyed filter elements. A variety of mordants are known which are compatible with the formation of photopatternable layers by the diazo resin. These approaches are described, for example, in European Patent Application 249,991.

However, these and other approaches have not been entirely satisfactory for a variety of reasons. The photopatternable compositions useful in forming dyed filter elements in solid state color imaging sensors advantageously exhibit a unique combination of properties. For example, the composition desirably exhibits good rheological properties for coatability, good speed, fine resolution, sharp pattern profiles, low scumming, uniform dye uptake and good dye density to thickness ratios. Additionally, it is desirable that the dyed filter element exhibit a low D-min after processing and good thermal and light stability. Moreover, in solid state color imaging sensor applications, it is particularly important that the filter elements be formed of materials that exhibit low absorbance of blue light and have good optical clarity.

Thus, the problem solved by this invention has been to provide a photopatternable composition useful in forming dyed filter elements having good thermal and light stability for solid state color image sensing devices, such composition exhibiting good rheological properties for coatability, good speed, fine resolution, sharp pattern profiles, low scumming, uniform dye uptake, good dye density to thickness ratios, a low D-min after processing and which exhibit less absorbance of blue light and have improved optical clarity than prior art compositions.

SUMMARY OF THE INVENTION

This invention provides high quality, high resolution solid state color image sensing devices having dyed filter elements of excellent thermal and light stability. The filter elements are formed from a dyeable resist composition which comprises, in admixture, a poly(vinyl alcohol) binder, a radiation sensitive dichromate, and a polymeric mordant derived from a quaternized N-vinylimidazole.

This invention is based at least partly on the discovery of the single phase negative-working dyeable photoresist composition described above, which is less colored and absorbs less blue light than the diazo resin/mordant and dichromated gelatin materials discussed above. Moreover, the dyeable photoresist composition, is water soluble, exhibits good rheological properties and excellent speed, fine resolution, sharp pattern profiles, low scumming, uniform dye uptake and good dye density to layer thickness ratios.

More particularly, in accordance with this invention, there is provided a solid state color image sensing device comprising a semiconductive support having a surface comprising an array of light sensing pixels and superimposed thereon in microregistration a color filter array having at least three sets of dyed filter elements characterized in that at least one set of the filter elements is formed from a negative working dyeable photoresist composition comprising, in admixture, (a) a poly(vinyl alcohol) binder, (b) a radiation sensitive dichromate, and (c) a polymeric mordant comprising recurring units derived from a quaternized N vinylimidazole. Color filter elements prepared from the dyeable photoresist composition have high resolution, excellent clarity and dye uptake, and low absorbance of blue light and thus are particularly useful in high quality, high resolution solid state color imaging sensors.

In another embodiment of this invention, there is provided a method of making the above-described solid state color image sensing device which includes the steps of (1) providing a semiconductive support having a surface comprising an array of light sensing pixels, (2) forming on the surface of the support a layer of the negative working dyeable photoresist composition described above, (3) exposing and developing the photoresist layer so that only the exposed areas remain and form a set of dyeable filter elements superimposed in microregistration on some of said light sensing pixels, and (4) dyeing the filter elements formed in step (3) by contacting them with at least one dye to form a set of dyed filter elements.

DESCRIPTION OF THE PREFERRED EMBODIMENTS

The dyed filter elements hereinafter described will be discussed primarily in regard to their utility in color filter arrays for solid state color image sensing devices of this invention and in methods for preparing such devices. However, the dyed filter elements also find utility in visual display units including liquid crystal displays and in the fabrication of color wheels.

The poly(vinyl alcohol), also reFerred to hereinafter as PVA, functions as a binder for the dyeable photoresist composition useful in the practice of this invention.

Poly(vinyl alcohols) having a number average molecular weight from 14,000 to 160,000 have been used with particular advantage in the practice of this invention. Preferred poly(vinyl alcohols) have a molecular weight oF about 40,000 to 100,000. The reason for this is that the PVA/mordant mixture viscosity advantageously provides a dried resist layer thickness having good dye density when dyed. Preferred poly(vinyl alcohols) are hydrolyzed, most preferably from 88% up to 100%. Such hydrolyzed poly(vinyl alcohols) provide enhanced solubility in the aqueous coating composition.

The poly(vinyl alcohol) is employed in combination with a radiation sensitive dichromate salt which functions as a hardening agent. The dichromate salt upon exposure to activating radiation produces a negative-working image after development of the resist. The dichromate salt is, for example, potassium, sodium or ammonium dichromate. Ammonium dichromate is particularly preferred for use herein. The dichromate sensitizer can be used conveniently in amounts of 0.001–0.10, preferably 0.005–0.05 weight percent based on the weight of the poly(vinyl alcohol) present in the resist composition. The dichromate advantageously forms virtually no unacceptable colored products with PVA during the photocrosslinking reaction and any excess, unused dichromate readily washes out oF the resist layer leaving it essentially colorless throughout the visible spectrum. However, the PVA resist alone does not dye adequately with anionic dyes or with acid dyes at low pH.

Polymeric mordants (for dyes) useful in the resist composition of this invention are derived from a quaternized N vinylimidazole. We have unexpectedly found that such mordants are compatible with the dichromate sensitized poly(vinyl alcohol) and provide a single phase resist composition.

Particularly useful polymeric mordants contain recurring units:

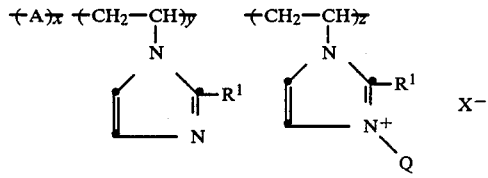

I.

wherein:

A is a unit derived from an ethylenically unsaturated monomer;
each $R^1$ is independently H or methyl;
Q is alkyl or aryl;
$X^-$ is an acid anion;
x is 0 to 65 mole percent;
y is 0 to 95 mole percent; and
z is 5 to 50 mole percent.

In the above formula, Q represents an alkyl or substituted alkyl group, the alkyl portion of which preferably contains from 1 to 12 carbon atoms, cycloalkyl, aryl or substituted aryl group, the aryl portion of which preferably contains from 6 to about 15 carbon atoms, such as methyl, ethyl, butyl, hydroxyethyl, hydroxypropyl, dihydroxypropyl, cyclo hexyl, phenyl, xylyl, tolyl, benzyl, diphenylmethyl, 4-methoxybenzyl, p-methoxyphenyl, 3,4-dimethoxyphenyl, 3,4-dimethoxybenzyl, 3,4-methylenedioxy benzyl, 3,4-ethylenedioxyphenyl, 2-(2,4,5-trimethoxyphenoxy)ethyl, 3-(3,4-dimethoxyphenoxy)-2-hydroxypropyl, 3-(2,4,5-trimethoxyphenoxy)-2-hydroxypropyl, 3,5-diethoxyphenyl, p-chlorobenzyl, 3,4-dibromobenzyl 3-(4-methoxyphenoxy)-2-hydroxypropyl, 3-(3,4-dimethoxyphenyl)propyl, 2-(3,4-methylene dioxyphenoxy)ethyl, or 2-(3,4-dimethoxyphenoxy)ethyl.

$X^-$ is any acid anion such as chloride, bromide, methanesulfonate, propionate p-toluenesulfonate, methylsulfate, nitrate, acetate, sulfate and the like.

The polymeric mordant used in this invention comprises from 0 to about 65 mole percent of units derived from an ethylenically unsaturated monomer. In preferred embodiments the polymer comprises 0 to about 60, more preferably 40–60 mole percent of the ethylenically unsaturated monomer.

Any ethylenically unsaturated monomer which is addition polymerizable is useful. Examples of such monomers include acrylic esters, such as methyl methacrylate, butyl acrylate, butyl methacrylate, ethyl acrylate, phenoxyethyl acrylate, and cyclohexyl acrylate; vinyl esters such as vinyl acetate, amides, such as acrylamide, diacetone acrylamide, N methyl acrylamide and methylacrylamide; nitriles, such as acrylonitrile and vinylphenylacetonitrile; ketones, such as methyl vinyl ketone, ethyl vinyl ketone, and p-vinylacetophenone; halides, such as vinyl chloride, vinylidene chloride and vinylbenzyl chloride, ethers, such as methyl vinyl ether, ethyl vinyl ether, and vinylbenzyl methyl ether; simple heterocyclic monomers such as vinylpyridine and vinylpyrrolidone; olefins such as ethylene, propylene, butylene and styrene as well as substituted styrenes; diolefins such as butadiene and 2,3-dimethylbutadiene and the like and other vinyl monomers within the knowledge and skill of an ordinary worker in the art. Styrene is employed to provide A in a particularly preferred embodiment of the invention.

In particularly preferred embodiments of the invention, each $R^1$ is hydrogen, A represents a styrene moiety, z is 10 to 25 mole percent and Q represents benzyl or hydroxyethyl.

Not all mordants are capable of functioning effectively with the dichromate sensitized poly(vinyl alcohol) binder. For example, some mordants, such as quaternary ammonium mordants, are incompatible with the sensitized binder, e.g., they do not form a single phase, because they precipitate in the presence of small amounts of dichromate, preventing the composition from being coated.

The above described polymeric mordants useful in the practice of this invention can be prepared by known polymerization techniques which can be carried out with an initiator such as potassium persulfate decomposition initiator, a potassium persulfate-sodium bisulfite redox initiator system, peroxides, e.g. benzoyl peroxide, azo catalysts, e.g. 2,2'-azobis(2-methylpropionitrile). and the like, preferably in a concentration of 0.5 to about 1.5 percent, based on total monomer, and at any temperature and pressure, but preferably at 60° C. to 120° C. and approximately at atmospheric pressure. The polymerization is preferably carried out in a solvent such as N,N-dimethylformamide, 1-methyl-2-pyrrolidinone and the like. A particularly preferred method for preparing the polymeric mordant is taught in Example 2 of U.S. Pat. No. 4,450,224.

The relative amounts of poly(vinyl alcohol) and mordant depend on the molecular weight of the PVA and the particular mordant selected, the particular dye selected to be imbibed, and other factors. PVA/mordant ratios of 1/1 up to 3/1 have been successfully employed. A preferred ratio is about 2/1. The reason for this is that the resulting mixture viscosity provides good photospeed and resist thickness latitude and good dye density. Lesser relative amounts of mordant produce lower dye density but higher resolution, whereas greater relative amounts of mordant produce higher dye density but lower resolution.

As noted, a particularly advantageous feature of the resist material is its ability to provide fine resolution, sharp pattern profiles and low scumming. These properties relate partly to the non swelling character of the resist. The swelling of the photo insolubilized resist depends in part on the mordant quaternizing species. For example, mordants quaternized with benzyl chloride were found to swell less than those quaternized with chloroethanol. On the other hand, the adhesion of the former to the substrate was not as good. Swelling also depends in part on the monomer ratio. Some swelling at low amounts of A and at amounts of the quaternized vinylimidazole over 25 mole % has been observed. Excellent results have been observed for amounts of the quaternized vinyl imidazole between 10 and 20 mole % and for amounts of A between about 40 and 60 mole %.

The dyeable resist composition can optionally include a variety of conventional addenda, for example surfactants and/or stabilizers, examples of which are readily obtainable from the literature.

A variety of alternative semiconductor image sensor support constructions are known in the art and are useful in forming the color imaging sensor of this invention. Representative examples of useful semiconductive supports are disclosed in U.S. Pat. No. 3,971,065, U.S. Pat. No. 4,322,753, U.S. Pat. No. 4,455,575 and U.S. Pat. No. 4,654,683. Preferred semiconductive supports have a surface comprising an array of light sensing pixels, wherein each pixel preferably is less than $1\times10^{-8} m^2$ in area. A more detailed description of a preferred support structure is provided in European Patent Application 249,991.

As employed herein the term "pixel" is defined as a single areally limited information unit of an image. The number of pixels making up an image can be varied widely, depending upon the application. For color imaging sensors according to this invention it is preferred that the support contain at least about $2\times10^5$ pixels, and for high visual quality, at least $1\times10^6$ pixels.

A photopatterned filter layer is most conveniently constructed by coating a solution of the negative working resist composition onto a planar semiconductive surFace. Any conventional method can be used to apply the composition to the support. The preferred method is application of a thin coating using an appropriate solvent. In making color filter elements for high resolution solid state imaging devices it is most common to coat the photopatternable resist layer by spin coating, however, other methods are useful. Useful coating techniques include spin coating, spray coating, curtain coating, and roll coating. The solvent used to prepare the resist composition for coating can be selected from any conventional coating solvent. Useful solvents include water and water miscible organic solvents such as alcohols, esters, ethers, and ketones. A particularly preferred solvent is water. Preferred final thicknesses of the resist vary, depending upon the final use. Examples of preferred thicknesses range from between about $0.1\mu$ to about $10\mu$.

It is contemplated that the filter elements can be provided on the semiconductive support in a variety of patterns. For high resolution sensors, it is preferred that the filter elements be provided in an interlaid pattern as described in European Patent Application 249,991 or in the form of tiny islands, such as described in U.S. Pat. No. 4,315,978.

Additive primary (blue, green and red) filter elements can be formed by imagewise exposing a layer comprised of the above described resist. Following development to remove unexposed portions of the layer, the additive primary dye is imbibed. The process can be twice repeated to produce the second and third sets of additive primary filters. Mixtures of subtractive primary (yellow, magenta and cyan) dyes can be used to form additive primary filters. Alternatively, as illustrated in the Examples which follow, additive primary filter elements can be formed by superimposing two filter elements containing subtractive primary dyes.

As used herein the term "microregistration" means that the filter elements and light sensing pixels are precisely aligned on a micron scale such that the filter area and the underlying sensing area or areas are substantially coextensive with each other. Further, the boundaries of such areas are substantially superimposed A single filter element may be superimposed over one sensing area or a group of sensing areas The importance of microregistration is readily apparent when one considers the very small size of the pixels useful in high resolution color image sensing devices and thus the correspondingly small size of the superposed filter elements.

After the patterned filter layer is formed, it is preferably dyed with a single dye. This can be achieved by bringing the dye in solution into contact with the filter layer and imbibing the dye into the filter layer. As the dye enters the layer by imbibition, the filter layer increases in optical density in direct relation to the amount of dye imbibed. As saturation of the filter layer by the dye is approached, the rates of additional dye imbibition and therefore further increase in the optical density of the filter layer progressively decline. This offers the advantage that an aim optical density of the filter layer can be reproducibly achieved without precisely controlling the duration of imbibition. It is preferred to saturate the filter layer with the dye, where "saturation" is defined as a dye concentration which produces an optical density that is increased by less than 5 percent when the duration of dye imbibition is doubled.

While any dye which can be deposited uniformly in the dyeable resist is useful in the practice of this invention, preferred dyes are anionic or zwitterionic dyes, which are therefore capable of being immobilized by the quaternized mordant. Any such dye can be used to form a visual image in the resist by imbibition. The dye chosen will, of course, depend upon the desired color and therefore upon the desired end use. Representative useful dyes are disclosed in U.S. Pat. No. 4,220,700, and in Published European Patent Application 249,991. Combinations of dyes can be imbibed to form the same filter element.

The preferred dyes can be readily dissolved in a polar solvent for imbibition into the resist layer. Aqueous dye solutions can be employed. However, any other convenient polar solvent compatible with the resist layer can be employed alone or in combination with water, if desired, such as, for example, methanol, ethanol, 4- butyrolactone dimethyl sulfoxide, dioxane, ethanolamine, or mixtures thereof. Preferred solvents are those which can be imbibed into the resist layer. Typically a small amount of a surfactant is also added to the dye solution to facilitate wetting of the resist layer.

Exemplary preferred yellow, magenta and cyan dyes are listed in Table I.

acrylate), poly(methyl methacrylate), and poly(carbonates).

Polyester ionomers constitute a preferred class of barrier materials. A particularly preferred class of polymers which meets the above described criteria are photocrosslinkable polyester ionomers. In preferred polyester ionomers the polyester contains at least one aromatic

TABLE I

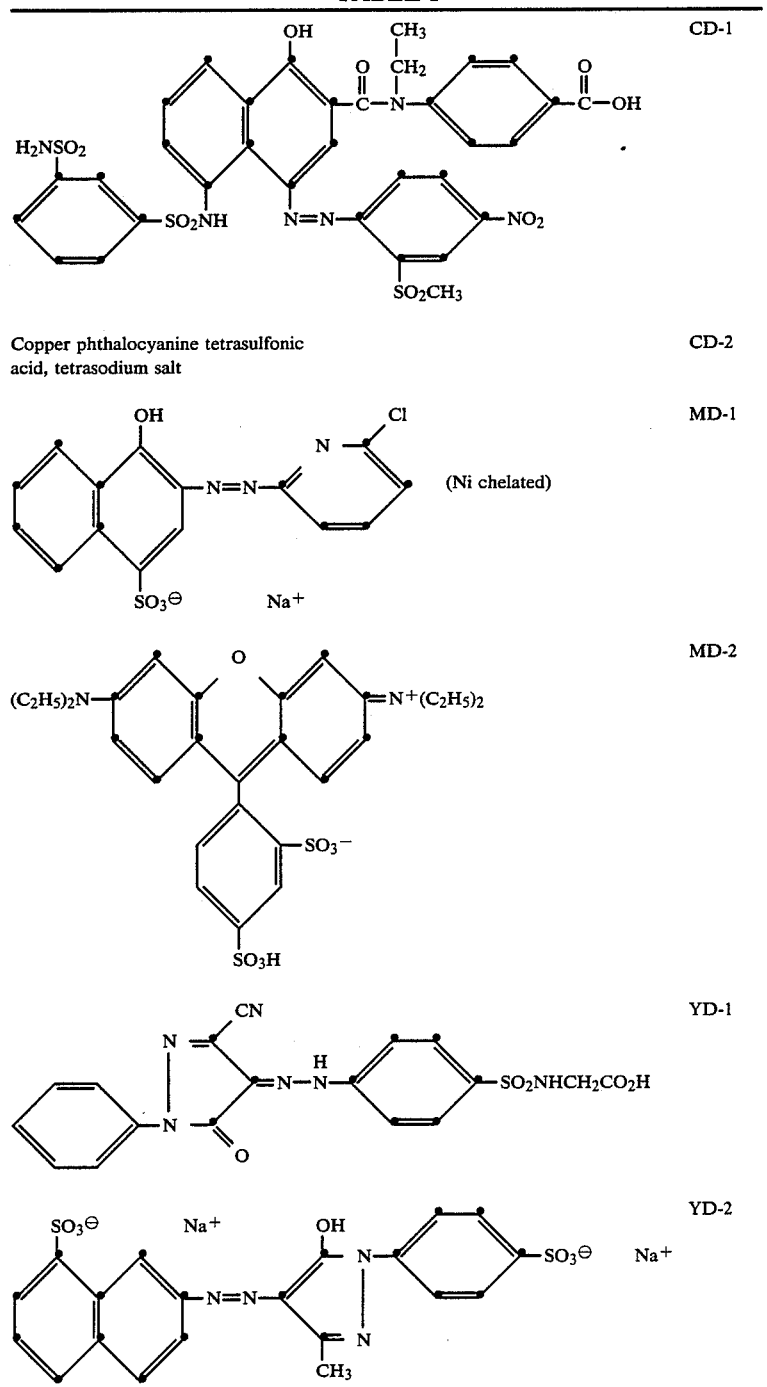

As a means of insuring that each dye is confined to a single filter layer, barrier layers between contiguous filter layers containing differing dyes can be employed. Useful barrier materials are known in the art and include, for example, nitrocellulose, poly(glydidyl methdicarboxylic acid derived repeating unit which contains an alkali metal sulfonate group or an iminodisulfonyl unit containing monovalent cations as imido nitrogen atom substituents. Photocrosslinkable polyester ionomers preferably contain a dicarboxylic acid derived repeating unit containing non aromatic ethylenic unsaturation capable of providing crosslinking sites.

In particularly preferred forms, the polyesters contain at least three dicarboxylic acid derived repeating units. One dicarboxylic acid derived repeating unit is the photocrosslinking unit. This unit crosslinks with similar units on other polymer chains on exposure to activating radiation as described previously. Another dicarboxylic acid derived repeating unit is the hydrophobic unit. The third dicarboxylic acid derived repeating unit is a unit comprising a sulfonate ionic group, i.e., a hydrophilic unit. The photocrosslinking unit can comprise from 30 to 90 and preferably from 30 to 70 mole percent of the total acid units of the polyester. The hydrophobic and ionic units can comprise from 5 to 50 and from 2 to 40 mole percent, respectively, of the total acid units of the polyester. The photocrosslinking group can be either part of the polymer backbone or pendent therefrom.

Specific examples of polyester ionomers and their utility in forming barrier layers can be found in Arcesi et al U.S. Pat. No. 3,929,489, Wagner et al U.K. Patent 1,407,059, and Hartman U.S. Pat. No. 4,315,978. Polyester ionomers are preferred barrier materials, since they are highly effective even when coated as thin layers.

A particularly preferred polyester ionomer is PEI-1 set forth below. According to convention, the glycol portion of the polyester is listed first, which is followed by the carboxylic acid portions of the polyester, and the mole percentages of these portions listed in parenthesis.
PEI-1   Poly[1,4-cyclohexylenebis(oxyethylene)-(1,4-phenylene)diacrylate-co succinate-co-3,3'-sodioimino disulfonyldibenzoate (60:25:15)]

EXAMPLES

The following specific preparations and examples further illustrate the invention.

Preparations

Preparation 1: PVA/mordant formulation 1 (2/1)

| | | |
|---|---|---|
| 10% | Poly(vinyl alcohol) Elvanol 71/30G in deionized water | 100.0 g |
| 20% | (NH$_4$)$_2$ Cr$_2$O$_7$ in deionized water pH adjusted to 7.0 with 5 g of a 28% solution of NH$_4$OH in water | 1 ml |
| 10% | Mordant of Formula I in deionized water wherein A = stryrene, R' = H, x = 50, y = 38, z = 12 quaternized with chloroethanol | 50.0 g |

The pH of the formulation was adjusted to 6.0 with 6N HCl. The dichromate was added to the PVA solution first and then the mordant was added slowly with stirring to avoid precipitation of the mordant due to a concentration effect.

Preparation 2: PVA/mordant formula 2(3/2) Same as preparation 1 except that mordant formulation was present in an amount of 66.7 g.

Preparation 3: Cyan Dye Solution

| | |
|---|---|
| CD-2 | 1.0 g |
| Surfactant A (a 50% aqueous solution of of nonylphenoxypolyglycidol) | 0.4 g |
| 4-Butyrolactone | 50 ml |
| pH 4 buffer | 150 ml |

Preparation 4: Magenta Dye Solution 1

| | |
|---|---|
| MD-1 | 0.125 g |
| Surfactant A | 0.4 g |
| Deionized water | 200 ml |
| pH adjusted to 3 with HCl | |

Preparation 5: Magenta Dye Solution 2

| | |
|---|---|
| MD-2 | 0.035 g |
| Surfactant A | 0.4 g |
| pH 4 buffer | 200 ml |

Preparation 6: Yellow Dye Solution 1

| | |
|---|---|
| YD-1 | 0.5 g |
| Surfactant A | 0.2 g |
| Distilled water | 100 ml |
| pH adjusted to 5.6 with NaOH | |

Preparation 7: Yellow Dye Solution 2

| | |
|---|---|
| YD-2 | 40 g |
| Surfactant A | 0.2 g |
| pH 4 buffer | 200 ml |

Preparation 8: Dye Barrier Polyesterionomer Solution 1

| | |
|---|---|
| PEI-1 | 5.0 g |
| Deionized water | 95.0 g |

Preparation 9: Dye Barrier Polyesterionomer Solution 2

| | |
|---|---|
| PEI-1 | 5.0 g |
| Chlorobenzene | 65.0 g |
| Methylene chloride | 30.0 g |

Preparation 10: Adhesion Promoting Solution

| | |
|---|---|
| Poly(acrylonitrile-co-vinylidene chloride-co-acrylic acid) (14.7/83.3/2) | 2.0 g |
| 2-Butanone | 100.0 g |

Example 1

A solid state color imaging sensor was prepared by fabricating a color filter array on a silicon charge-coupled device wafer containing active imaging chips according to the procedure which follows. The individual pixels of the sensor were less than $1 \times 10^{-8} m^2$ in area. The blue, green and red filters were prepared by superimposing two filter elements containing subtractive primary dyes, i.e., the red filter was formed From superimposed yellow and magenta dyed resist layers, the green filter was formed from superimposed yellow and cyan dyed resist layers, and the blue filter was formed from superimposed magenta and cyan dyed resist layers.

Formation of Cyan Filter Elements Set

1. The wafer was spin coated at 4000 rpm for 2 min with the PVA/mordant resist formulation of Preparation 1.

2. The wafer was exposed to 595 millijoules of UV light in the range from 365 to 438 nm through a chrome mask for cyan, using a Canon PVA 501F mask aligner in the contact mode, aligned to the device wafer for cyan stripes.

3. The wafer was rinsed in deionized water for 60 seconds to remove unexposed resist and reveal the leuco cyan stripe pattern.

4. The wafer was dyed in Cyan Dye Solution 1 for 4 minutes and then rinsed with deionized water and dried.

5. Dye Barrier Polyesterionomer Solution 1 was spin coated onto the wafer at 2000 rpm, rinsed with deionized water and dried.

6. The wafer was then exposed uniformly to 1575 millijoules of UV light.

Formation of Magenta Filter Element Set

1. The wafer was then spin coated at 6000 rpm for 2 min with the formulation of preparation 1.

2. The wafer was aligned for the magenta stripes and exposed to 595 millijoules of uv light in the range from 365 to 438 nm through a chrome mask for magenta using the Canon mask aligner.

3. The wafer was rinsed in deionized water for 60 seconds to remove unexposed resist and reveal the leuco magenta stripe pattern.

4. The wafer was dyed in Magenta Dye Solution 2 for 3 minutes and then rinsed with deionized water and dried.

5. Dye Barrier Polyesterionomer Solution 2 was spin coated onto the wafer at 2000 rpm and then the wafer was rinsed with methylene chloride and dried.

6. The wafer was then uniformly exposed to 1575 millijoules of UV light.

7. Adhesion Promoting Solution was spin coated at 6000 rpm and then the wafer was dried.

Formation of Yellow Filter Element Set

1. The formulation of Preparation 2 was then spin coated over the wafer at 1500 rpm for 2 minutes.

2. The wafer was aligned for the yellow stripes and exposed to 770 millijoules of UV light (365 to 438 nm) through a chrome mask for yellow using the Canon mask aligner.

3. The wafer was rinsed in deionized water for 60 seconds to remove unexposed resist and reveal the yellow stripe pattern.

4. The wafer was dyed in Yellow Dye Solution 1 for 5 minutes, rinsed with deionized water and dried.

The result was a high quality high resolution solid state color imaging sensor having a color filter array with green filters that were 68% transmitting at 525 nm, red filters that were 90% transmitting at 669 nm, and blue filters that were 75% transmitting at 460 nm. Color rendition using standard test patterns was good overall and flesh tones were excellent.

Example 2

A filter array was formed on the surface of a charge coupled device by a sequence of steps similar to those described in Example 1, but with the dyes CD-2, MD-2 and YD-2 being imbibed in that order. The sensor showed excellent chrominance discrimination in image recording.

The thermal and light stability of the dyed PVA/-mordant resists were tested by fabricating color wheels. The dyed resist elements in the color wheels were overcoated with an environmental protection layer formed from a solution of 20 g PVA and 4 ml $(NH_4)_2Cr_2O_7$ in 180 g deionized water (this and other PVA containing formulations provide excellent environmental protection layers, e.g. oxygen barrier layers, over dyed resist layers in color filter elements). The dyes in the PVA/-mordant resist matrix were remarkably stable and this was found to be so for a number of test color wheels even when baked at 225° C. in nitrogen for 30 minutes. It is believed that the PVA acts as an oxygen barrier to prevent or retard oxygen attack on the dyes. The stability of various dyes in the PVA/mordant matrix was superior compared to the same dyes in a layer that did not contain PVA.

The invention has been described in detail with particular reference to preferred embodiments thereof, but it will be understood that variations and modifications can be effected within the spirit and scope of the invention.

What is claimed is:

1. A solid state color image sensing device comprising a semiconductive support having a surface comprising an array of light sensing pixels and superimposed thereon in microregistration of color filter array having at least three sets of dyed filter elements characterized in that at least one set of said filter elements is formed from a negativeworking dyeable photoresist composition comprising, in admixture,
   (a) a poly(vinyl alcohol) binder,
   (b) a radiation-sensitive dichromate, and
   (c) a polymeric mordant comprising recurring units derived from a quaternized N-vinylimidazole wherein said polymeric mordant contains recurring units:

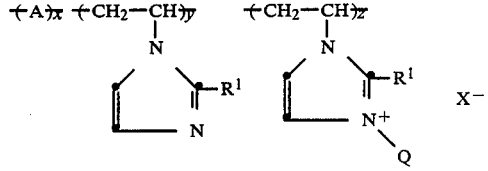

wherein:

A is a unit derived from an ethylenically unsaturated monomer:

each $R^1$ is independently H or methyl;

Q is alkyl or aryl;

X- is an acid anion;

x is 0 to 65 mole percent;

y is 0 to 95 mole percent; and z is 5 to 50 mole percent.

2. The device of claim 1 wherein said sets of filter elements are cyan, magenta and yellow.

3. The device of claim 1 wherein each pixel is less than $1 \times 10^{-8} m^2$ in area.

4. A method of making a solid state color image sensing device comprising a semiconductive support having a surface comprising an array of light sensing pixels having thereon a color filter array having at least three sets of dyed filter elements, said method comprising the steps of:

(1) providing a semiconductive support having a surface comprising an array of light sensing pixels, (2) forming on said surface a layer of a negative-working dyeable photoresist composition comprising, in admixture
   (a) a poly(vinyl alcohol) binder, (b) a radiation-sensitive dichromate and
(c) a polymeric mordant comprising recurring units derived from a quaternized N-vinylimidazole wherein said polymeric mordant contains recurring units:

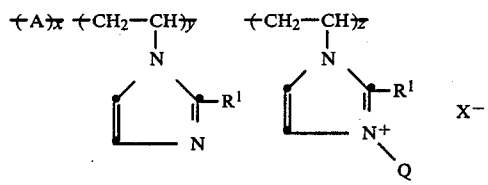

wherein:

A is a unit derived from an ethylenically unsaturated monomer;
each $R^1$ is independently H or methyl;
Q is alkyl or aryl;
$X^-$ is an acid anion;
x is 0 to 65 mole percent;
y is 0 to 95 mole percent; and
z is 5 to 50 mole percent;

(3) exposing and developing said photoresist layer so that only the exposed areas remain and form a set of dyeable filter elements superimposed in microregistration on some of said light sensing pixels, and (4) dyeing said filter elements formed in step (3) by contacting them with at least one dye thereby forming a set of dyed filter elements.

* * * * *